United States Patent
Huang et al.

(10) Patent No.: US 6,740,978 B2
(45) Date of Patent: May 25, 2004

(54) CHIP PACKAGE CAPABLE OF REDUCING MOISTURE PENETRATION

(75) Inventors: Chien-Ping Huang, Chudon Town (TW); Chih-Chin Liao, Yenlin Town (TW); Yung-Kang Chu, Taipei (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/418,698

(22) Filed: Apr. 18, 2003

(65) Prior Publication Data

US 2003/0205821 A1 Nov. 6, 2003

Related U.S. Application Data

(60) Division of application No. 10/001,862, filed on Nov. 19, 2001, now Pat. No. 6,593,658, which is a continuation-in-part of application No. 09/392,139, filed on Sep. 9, 1999, now abandoned.

(51) Int. Cl.[7] .............................................. H01L 23/48
(52) U.S. Cl. .................... 257/773; 257/784; 257/786
(58) Field of Search ................. 257/737, 736, 257/773, 774, 778–780, 784, 786, 787; 361/772, 777; 174/250, 251, 255, 261, 262

(56) References Cited

U.S. PATENT DOCUMENTS

| | | | |
|---|---|---|---|
| 4,602,271 A | * 7/1986 | Dougherty et al. | ......... 257/700 |
| 5,060,370 A | 10/1991 | Scales et al. | |
| 5,990,547 A | 11/1999 | Sharma et al. | |
| 6,252,305 B1 | 6/2001 | Lin et al. | |
| 6,271,579 B1 | 8/2001 | Going et al. | |
| 6,441,453 B1 | 8/2002 | Tindle | |
| 6,461,897 B2 | 10/2002 | Lin et al. | |
| 6,593,658 B2 | * 7/2003 | Huang et al. | ............... 257/773 |

* cited by examiner

Primary Examiner—Alonzo Chambliss
(74) Attorney, Agent, or Firm—Klarquist Sparkman, LLP

(57) ABSTRACT

A semiconductor chip package is formed to be capable of reducing moisture erosion by configuring the bonding finger, the plating-conduction-line, and the trace on the chip carrier therein in such a way that the length of path for moisture to penetrate and to reach the bonding finger through a plating-conduction-line is significantly longer than those implemented in a conventional chip package.

10 Claims, 4 Drawing Sheets

CHIP PACKAGE CAPABLE OF REDUCING MOISTURE PENETRATION

CROSS REFERENCED TO RELATED APPLICATION

This is a divisional application of prior U.S. application Ser. No. 10/001,862, filed on Nov. 19, 2001, now U.S. Pat. No. 6,593,658 which is a continuation-in-part of application Ser. No. 09/392,139, filed on Sep. 9, 1999, now abandoned.

FIELD OF THE INVENTION

The present invention generally relates to a semiconductor chip package in which at least a chip is attached to a chip carrier having at least a bonding finger and a plating-conduction-line formed thereon and connected with each other, and particularly to a chip package capable of minimizing erosion caused by moisture penetration through a plating-conduction-line.

BACKGROUND OF THE INVENTION

As shown in FIG. 1, for better connection of bonding wires 2 of a chip 1 to the bonding fingers 3 on a chip carrier 4 (a substrate for example), special material such as a thin gold layer must be plated on each bonding finger 3 of the chip carrier 4, therefore plating-conduction-lines 7 must be formed on the chip carrier 4 so that each bonding finger 3 of the chip carrier 4 is connected with one of the plating-conduction-lines 7, thereby electrical current can be conducted to each of the bonding fingers 3 respectively via one of the plating-conduction-lines 7, in order to plate such special material on each of the bonding fingers 3. The chip carrier 4 shown in FIG. 1 is one of many obtained by dividing a large sheet of interim product, and has each plating-conduction-line 7 thereon cut, as a result of dividing the large sheet of interim product into many chip carriers, to have its first end on an edge such as 91 (or 93) of the chip carrier 4 shown in FIG. 1B, where the edge 91 (or 93) is the chip carrier's edge closest to the bonding finger 3 connected with the second end of the plating-conduction-line 7. The second end of the plating-conduction-line 7 connects the bonding finger 3 via a first line 301 of the bonding finger 3. The prior art in FIG. 1 also comprises bonding wires 2, ball pads 62, at least a via 61, an encapsulation layer 5, and traces 8 connecting bonding finger 3 and ball pads 62 through at least a via 61, and the chip carrier thereof includes edges 91, 92, 93, and 94. The length of the plating-conduction-line 7 spanning the first line 301 of the bonding finger 3 and the edge 91 always corresponds to the size of the gap 11 between the first line 301 of the bonding finger 3 and the edge 91, edge 91 being the chip carrier's one edge which is closest to the first line 301 of the bonding finger 3, as can be seen from FIG. 1B. The length of the path for moisture to penetrate from edge 91 of the chip carrier 4 to the bonding finger 3 through plating-conduction-line 7 is the size of the gap 11 shown in FIG. 1B. A second line 302 of bonding finger 3 shown in FIG. 1B is for better comparison between the present invention and the prior art, as recited in the specification of the present invention.

Although a thin and small IC package can be achieved by conventional packaging technologies such as those for forming a CSP (chip scale package) based on wire bonding, the difference in size between the IC package and the chip therein is so small that the bonding finger 3 on the chip carrier (such as a substrate or a tape 4 shown in FIG. 1) in the package cannot be spaced from each edge (usually corresponding to the edge such as 91 or 93 of the chip carrier 4 shown in FIG. 1) of the package by a distance which is long enough to significantly reduce moisture penetration through a plating-conduction-line 7 spanning the bonding finger 3 and the edge 91 or 93 which is closest to the bonding finger 3 as shown in FIG. 1B, resulting in poor reliability of products. For an example in which a bonding finger is spaced from an edge (corresponding to an edge of a chip carrier) of a package by a distance no less than 0.165 mm, the layout of traces and bonding fingers becomes a problem particularly when packaging a memory chip which is usually relatively large. However, reducing the distance between the bonding finger and the edge of the package to solve the problem will inevitably lead to easier moisture penetration through a plating-conduction-line such as 7 of FIG. 1B in the prior art chip package, because a conventional semiconductor chip package, as can be seen from FIG. 1B, always has its plating-conduction-line 7 connecting a bonding finger 3 via the first line 301 of the bonding finger 3 and having an end on one of the chip carrier's edges which is closest to bonding finger 3, such as the edge 91 (or 93) in FIG. 1B. The conventional plating-conduction-line 7, as shown in FIG. 1B, always connects the bonding finger 3 in a direction perpendicular to the first line 301 of the bonding finger 3. The first line 301 of the bonding finger 3 faces (i.e., approximately parallels) the edge 91 (or 93) closest thereto.

Referring again to FIG. 1, in which a conventional chip package 10 comprises a chip carrier 4 such as a substrate or a tape to which a semiconductor chip 1 connecting a bonding wire 2 is attached, the chip carrier 4 including at least a bonding finger 3 formed thereon for connecting the bonding wire 2 and at least a trace 8 as well as a plating-conduction-line 7 both also formed thereon. The plating-conduction-line 7 has its first end on an edge 91 of chip carrier 4 and its second end connected to bonding finger 3, and spans the gap 11 which is defined by edge 91 and a first line 301 of bonding finger 3, the first line 301 facing edge 91 i.e., plating-conduction-line 7 is connected to bonding finger 3 in a direction perpendicular to first line 301 of bonding finger 3, resulting in a shortest path for moisture to penetrate into conventional chip package 10 from edge 91 of chip carrier 4 along plating-conduction-line 7 in a direction as indicated by arrow 12, leading to serious erosion of components inside conventional chip package 10, particularly the erosion of bonding finger 3 therein, even though the bonding finger 3, plating-conduction-line 7, as well as the bonding wire 2 and chip 1 are covered by an encapsulation layer 5. The present invention is therefore hereby disclosed to provide a scheme for resolving the problem.

SUMMARY OF THE INVENTION

An object of the present invention is to provide a chip package having a better layout of traces, bonding finger, and plating-conduction-line, in order to increase the length of path for moisture to penetrate thereinto, thereby the erosion of components in the chip package can be significantly minimized.

The present invention is characterized by configuring a semiconductor chip package in such a way that a semiconductor chip package is attached to a chip carrier (such as a substrate, or a tape, or any material capable of supporting the chip and accommodating circuits) having thereon at least a bonding finger, and at least a plating-conduction-line with one end thereof on a selected edge of the chip carrier and being electrically conductive to the bonding finger through a path very different from those in a conventional semiconductor chip package, thereby the length of the path for moisture to reach the bonding finger or another components in the semiconductor chip package is significantly greater than that of a conventional semiconductor chip package, whereby moisture erosion can be effectively reduced. The plating-conduction-line is for conducting to the bonding finger the electrical current applied to its end on the selected edge of the chip carrier for plating special material such as gold on the bonding finger, in order to achieve better connection between the bonding wire and the bonding finger of the chip carrier.

One preferred aspect of the present invention is represented by a semiconductor chip package comprising:
at least a semiconductor chip;
at least a chip carrier having a front surface to which the chip is attached, and having a back surface, at least a via, and a plurality of edges;
at least a bonding finger formed on the front surface of the chip carrier to electrically connect the chip;
a metal pad (for example, a ball pad attached to the back surface of the chip carrier in conventional IC packages);
at least a first conduction line such as a trace formed on the front surface of the chip carrier for connecting the bonding finger and the metal pad through the via; and
at least a second conduction line such as a plating-conduction-line formed on the front surface of the chip carrier, with a first end thereof on an edge of the chip carrier, and a second end thereof connecting the first conduction line to be electrically connecting to the bonding finger, the second conduction line for conducting to the bonding finger the electrical current applied to its first end (on an edge of the chip carrier) for plating material on the bonding finger.

According to the embodiment of the present invention, the electrical current applied to the first end of the second conduction line for plating material on the bonding finger, is conducted to the bonding finger via the second conduction line and the part of the first conduction line which is between the second end of the second conduction line and the bonding finger.

The above second conduction line may be what is usually called "plating-conduction-line" in related industries. The plating-conduction-line on the chip carrier is left from dividing a large sheet of interim product into a plurality of chip carriers, i.e., the plating-conduction-line connecting a bus plating-conduction-line on the large sheet of interim product is cut open with an end (corresponding to the first end of a second conduction line provided by the present invention) on an edge of the chip carrier which is one among many obtained by dividing the large sheet of interim product.

The above first conduction line may be what is usually called "trace" in related industries. It is to electrically connect a bonding finger and a metal pad such as a conventional ball pad, and conventionally for conducting electrical signals between a bonding finger and a ball pad.

In a chip package so provided by the present invention, the path for conducting electrical current to a bonding finger for plating the bonding finger includes the second conduction line and part of the first conduction line (i.e., the part of the second conduction line which is between the second end of the second conduction line and the bonding finger), and is significantly different from that of a conventional chip package in which the path for conducting electrical current to a bonding finger for plating the bonding finger is a plating-conduction-line spanning the bonding finger and the chip carriers edge that is closest to the bonding finger, resulting in significantly longer distance for moisture to reach the bonding finger or the other components of a chip package provided by the present invention, leading to better protection against moisture erosion in the chip package provided by the present invention. This is particularly obvious when the chip carrier is so designed that the first conduction line such as a trace has every portion thereof spaced from each edge by a gap which is not too small.

Another preferred aspect of the present invention is represented by a semiconductor chip package comprising:
at least a semiconductor chip;
at least a chip carrier having a front surface to which the chip is attached, and having a plurality of edges;
at least a bonding finger formed on the front surface of the chip carrier to electrically connect the chip, and having a first line and a second line, the first line thereof facing (i.e., approximately parallel to) a selected edge of the chip carrier, and the second line being approximately perpendicular to the selected edge of the chip carrier; and
at least a plating-conduction-line formed on the front surface of the chip carrier to have one end thereof on the selected edge of the chip carrier and another end thereof connecting the bonding finger via the first line of the bonding finger, thereby the length of the plating-conduction-line which is between the first line of the bonding finger and the selected edge of the chip carrier is certainly longer than what is implemented in a conventional chip package such as the prior art shown in FIG. 1. In the prior art of FIG. 1, a plating-conduction-line 7 always has one end thereof on a selected edge of a chip carrier (such as the selected edge 91 of chip carrier 4 shown in FIG. 1B) and another end thereof connecting a bonding finger 3 via the bonding finger's first line 301 which faces (i.e., approximately parallels) the selected edge 91. The plating-conduction-line 7 in the conventional chip package as shown in the prior art of FIG. 1 usually connects bonding finger 3 in a direction perpendicular to the first line 301 of the bonding finger 3. It must be noted the plating-conduction-line according to the present invention, if compared to prior art referring to FIG. 1, will correspond to a plating-conduction-line 7 in FIG. 1B with its first end on the edge 91 while with its second end connecting a bonding finger 3 via a second line 302 of the bonding finger 3 instead of the first line 301 of the bonding finger 3. This is very different from the prior art of FIG. 1 in which a plating-conduction-line 7 connects bonding finger 3 via a first line 301 of the bonding finger 3 instead of the second line 302 of the bonding finger 3, the first line 301 facing (i.e., approximately parallel to) the edge 91 while the second line 302 being approximately perpendicular to the edge 91. The difference results in significantly longer distance, compared to the prior art, for moisture to penetrate from the first end of the plating-conduction-line to the bonding finger in the chip package provided by the present invention.

Obviously the semiconductor chip package provided by the present invention may further comprise at least a chip-electrical-connector such as a bump of a flip chip or a wire of an ordinary chip, for electrically connecting the chip and the bonding finger, and may also further comprise at least a ball pad, as well as a trace connecting the bonding finger and the ball pad through a via of the chip carrier. Also the semiconductor chip package provided by the present invention may further comprise at least an encapsulation layer overlying the front surface of the chip carrier to cover the semiconductor chip, the chip-electrical-connector, the bonding finger, and the plating-conduction-line. It shall be understood the encapsulation layer overlying the front surface of the chip carrier may also cover the trace.

The present invention may best be understood through the following description with reference to the accompanying drawings, in which:

BRIEF DESCRIPTION OF THE DRAWINGS

FIG. 1 is a diagram showing a conventional configuration of components in a semiconductor chip package, wherein

FIG. 2 is a diagram illustrating a first preferred embodiment of a semiconductor chip package according to the present invention, wherein

FIG. 3 shows a second preferred embodiment of a semiconductor chip package according to the present invention, wherein

FIG. 4 shows a third preferred embodiment of a semiconductor chip package according to the present invention, wherein

DETAILED DESCRIPTION OF THE PREFERRED EMBODIMENTS

Figure 2A:
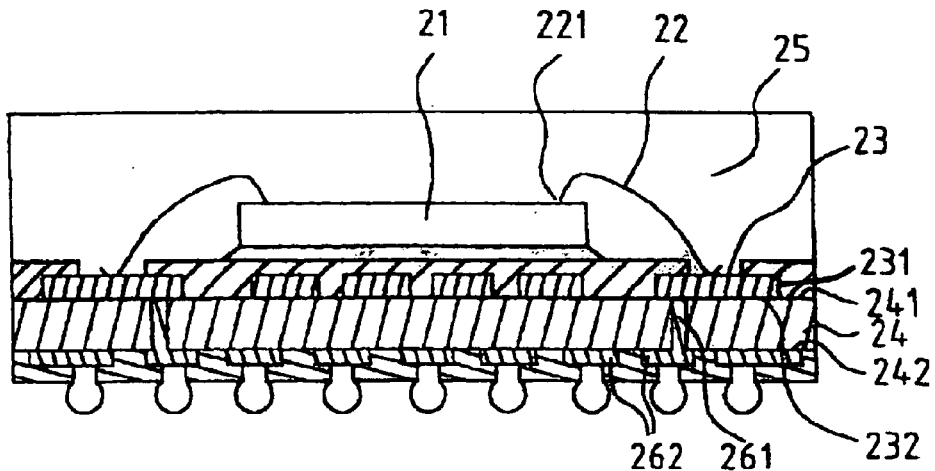
FIG. 2A shows a cross sectional view of the package based on the present invention and FIG. 2B shows a top view of the package based on the present invention.
Figure 2B:
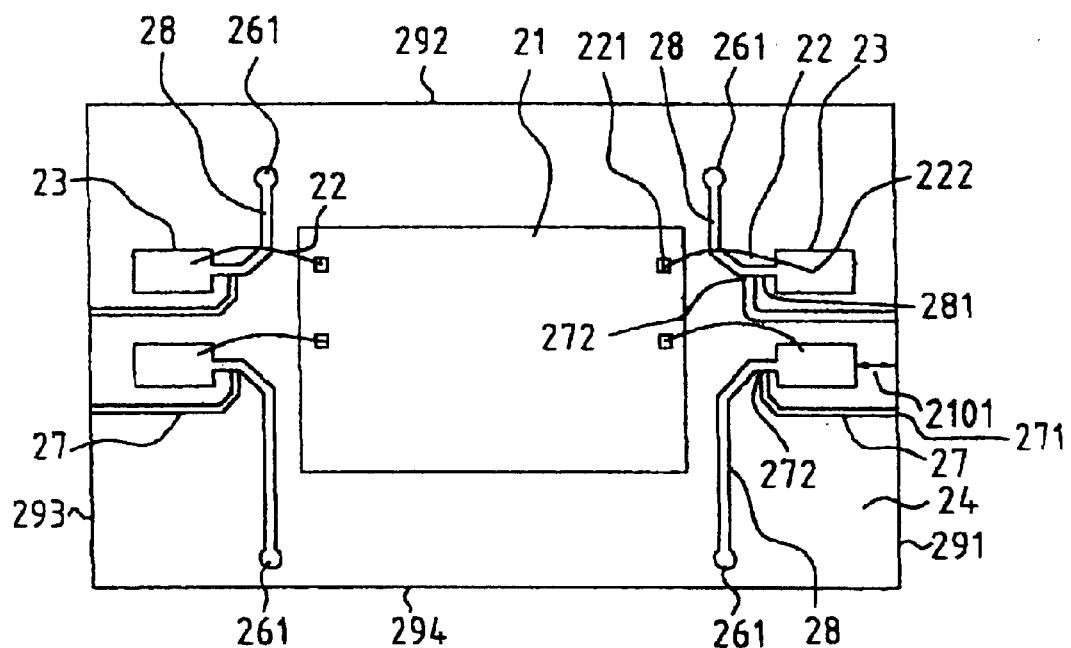

Shown in FIG. 2 is the first preferred embodiment of a semiconductor chip package according to the present invention, which comprises: a semiconductor chip 21; at least a chip-electrical-connector 22 (such as a wire suitable for electrical connection between a chip and any metal/metal compound, or a bump of a flip chip) having a first end 221 and a second end 222, with the first end 221 thereof connecting the semiconductor chip 21; at least a chip carrier 24 having a front surface 241 to which the semiconductor chip 21 is attached, a back surface 242, and a plurality of edges 291, 292, 293, and 294; at least a bonding finger 23 formed on the front surface 241 of the chip carrier 24 and spaced from each edge such as 291, 292, 293, or 294 of the chip carrier by a respective distance (not necessarily the same for spacing from each edge) larger than a predetermined value represented by a gap 2101; at least a first conduction line 28 such as a trace connecting the bonding finger 23 and a metal pad such as a ball pad 262 (shown in FIG. 2A) through a via 261, the first conduction line 28 for conducting electrical signals between the ball pad 262 and bonding finger 23, the ball pad 262 attached to the back surface 242 of the chip carrier 24; and at least a second conduction line 27 such as a plating-conduction-line formed on the chip carrier 24 to have a first end 271 on an edge 291 of the chip carrier 24, and have a second end 272 connecting the first conduction line 28 to be electrically connecting to the bonding finger 23 through a conducting-auxiliary-path including at least a part 281 of the first conduction line 28 (i.e., the part of first conduction line 28 which is between the second end 272 of second conduction line 27 and the bonding finger 23). The conducting-auxiliary-path may be just the part 281 of the first conduction line 28. The second conduction line 27 is for conducting to the bonding finger the electrical current applied to the first end 271 thereof for plating material on the bonding finger 23. The first conduction line 28 may include a conducting-auxiliary-path which is the part of said first conduction line 28 between bonding finger 23 and the second end 272 of second conduction line 27. The conducting-auxiliary-path, when plating material on said bonding finger, conducts an electrical current from the second end 272 of second conduction line 27 to bonding finger 23, the electrical current being applied to second conduction line 27 via the first end 271 of the second conduction line 27. It must be noted the second conduction line 27 is the line left on the chip carrier 24 after it is used to conduct to bonding finger 23 the electrical current applied to the first end 271 thereof for plating material on the bonding finger 23.

The first preferred embodiment of a semiconductor chip package according to the present invention may have the conducting-auxiliary-path and the second conduction line 27 (or plating-conduction-line 27) thereof so configured that the total length of the conducting-auxiliary-path and the second conduction line 27 is longer than a desired value, in order to increase the total length of path for moisture to reach the bonding finger 23, and thereby to keep moisture erosion within a tolerable range.

Obviously the first preferred embodiment of a semiconductor chip package according to the present invention may further comprise at least an encapsulation layer 25 overlying the front surface 241 of the chip carrier 24 to cover the semiconductor chip 21, the chip-electrical-connector 22, the bonding finger 23, or even the first conduction line 28 and the second conduction line 27.

Figure 1A:
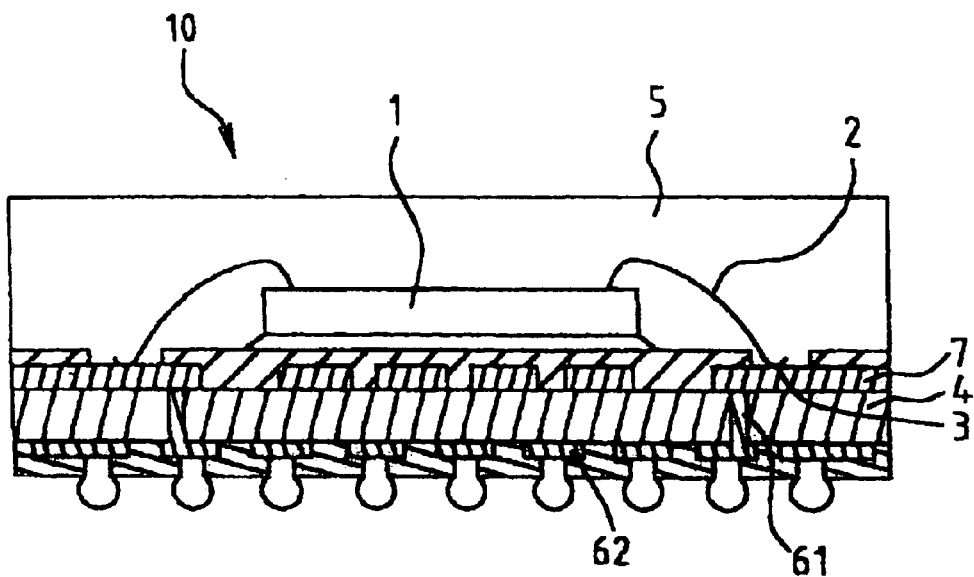
FIG. 1A shows a cross sectional view of the package and FIG. 1B shows a top view of the package.
Figure 1B:
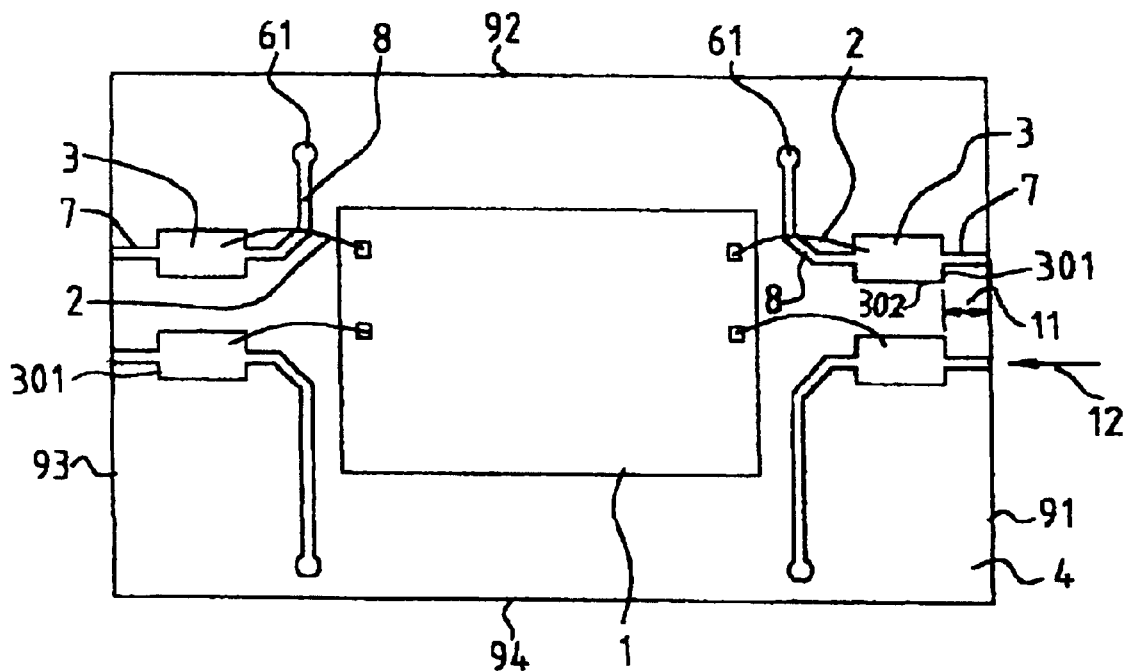
Figure 3A:
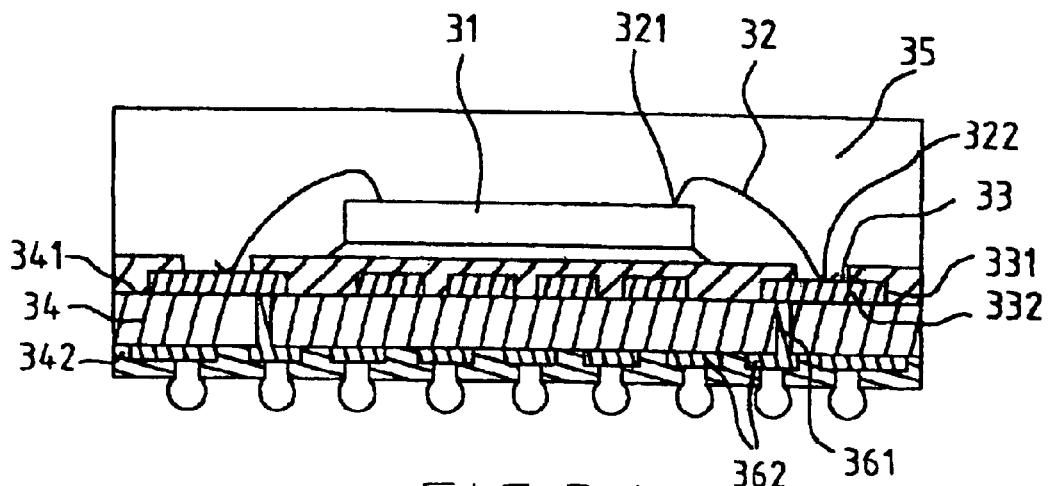
FIG. 3A shows a cross sectional view of the package based on the present invention and FIG. 3B shows a top view of the package based on the present invention.
Figure 3B:
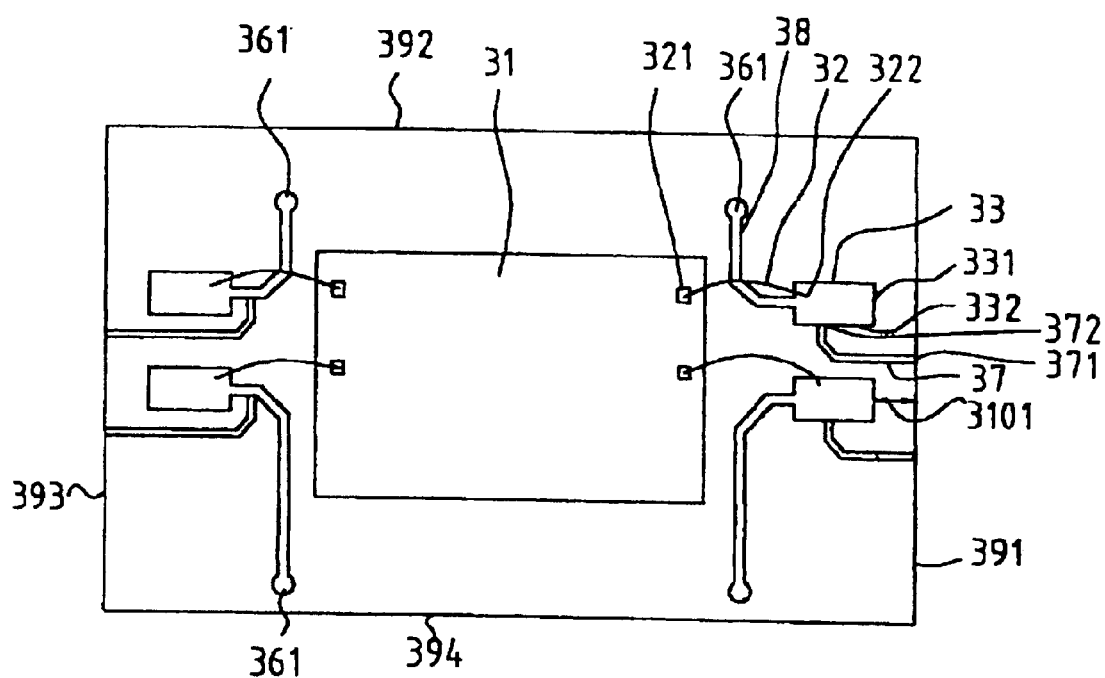

A second preferred embodiment of a semiconductor chip package according to the present invention is shown in FIG. 3, which comprises: at least a semiconductor chip 31; at least a chip-electrical-connector 32 having a first end 321 and a second end 322, the first end 321 thereof connecting the semiconductor chip 31; at least a chip carrier 34 having a front surface 341 to which the chip 31 is attached, and having a back surface 342 and a plurality of edges 391, 392, 393, and 394; at least a bonding finger 33 formed on the front surface 341 of the chip carrier 34 to have a first line 331 and a second line 332, the first line 331 facing (i.e., approximately parallel to) a selected edge 391 of the chip carrier 34, the second line being approximately perpendicular to the selected edge 391 of the chip carrier 34; and at least a plating-conduction-line 37 formed on the front surface 341 of the chip carrier 34 to have one end 371 thereof on the selected edge 391 of the chip carrier 34 and another end 372 thereof connecting the second line 332 of the bonding finger 33, thereby the length of the plating-conduction-line 37 which is between the second line 332 of bonding finger 33 and the selected edge 391 of the chip carrier 34 is certainly longer than what is implemented in a conventional chip package such as the prior art shown in FIG. 1, wherein a plating-conduction-line 7 always has one end thereof on a selected edge of a chip carrier (such as the selected edge 91 of chip carrier 4 shown in FIG. 1B) and another end thereof connecting a bonding finger 3 via the bonding finger's first line 301 which faces (i.e., approximately parallels) the selected edge 91. The plating-conduction-line 7 in the conventional chip package as shown in FIG. 1 (prior art) usually connects bonding finger 3 in a direction perpendicular to the first line 301 of the bonding finger 3. It must be noted the plating-conduction-line according to the embodiment of the present invention shown in FIG. 3, if compared to prior art referring to FIG. 1, will correspond to a plating-conduction-line in FIG. 1 with its first end on the edge 91 and its second end connecting a bonding finger 3 via a second line 302 of the bonding finger 3 instead of a first line 301 of the bonding finger 3, while a plating-conduction-line 7 of the prior art as shown in FIG. 1 connects a bonding finger 3 via a first line 301 of the bonding finger 3 instead of second line 302 of the bonding finger 3, the first line 301 facing (i.e., approximately parallel to) the edge 91 while the second line 302 being approximately perpendicular to the edge 91. The difference certainly results in longer distance, compared to the prior art as shown in FIG. 1, for moisture to penetrate from the first end 371 of the plating-conduction-line 37 to the bonding finger 33 in the chip package provided by the present invention as can be seen from FIG. 3B. The plating-conduction-line 37 is the line left on chip carrier 34 after it is used to conduct to a bonding finger 33 the electrical current applied to the first end 371 thereof for plating material on the bonding finger 33.

The second preferred embodiment of a semiconductor chip package provided by the present invention as shown in FIG. 3, may be so configured that the first line 331 of bonding finger 33 is spaced from an edge 391 of the chip carrier 34 by a first distance 3101, and the second line 332 of bonding finger 33 is spaced from each of edges 391, 392, 393, and 394 of chip carrier 34 by a respective distance larger than the first distance 3101, thereby the plating-conduction-line 37 formed on the front surface 341 of the chip carrier 34 to have one end 371 thereof on the edge 391 of the chip carrier 34 and another end 372 thereof connecting the bonding finger 33 via the second line 332 of bonding finger 33, will always be longer than the first distance 3101 which corresponds to the length of a plating-conduction-line 7 (please refer to FIG. 1B) of a conventional chip package as shown in FIG. 1. The embodiment of the present invention thus provides longer distance for moisture to penetrate from the edge 391 to bonding finger 33 through plating-conduction-line 37. The first distance 3101 may be determined according to the sizes of the chip and the chip carrier, as well as fabrication feasibility, or another factors, i.e., the first distance 3101 is determined according to the difference in size between the chip 31 and the chip carrier 34, and another factors.

The second preferred embodiment of a semiconductor chip package according to the present invention, as shown in FIG. 3, may further comprise at least a metal pad such as a conventional ball pad 362, and at least a trace 38 connecting the bonding finger 33 and the ball pad 362 through at least a via 361. The metal pad is attached to the back surface 342 of chip carrier 34. It may also further comprise at least an encapsulation layer 35 overlying the front surface 341 of the chip carrier 34 to cover the semiconductor chip 31, the chip-electrical-connector 32, the bonding finger 33, or even the trace 38 and the plating-conduction-line 37.

The second preferred embodiment of a semiconductor chip package according to the present invention may have the bonding finger 33 thereof in any shape with its first line facing (i.e., approximately parallel to) one edge of chip carrier 34 (such as edge 391), and its second line facing (i.e., approximately parallel to) one of the other edges of chip carrier 34 such as 392, or 393, or 394.

Figure 4A:
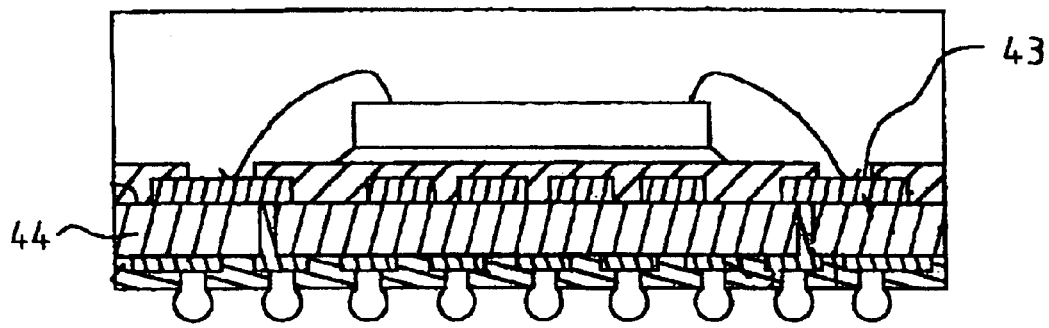
FIG. 4A shows a cross sectional view of the package based on the present invention and FIG. 4B shows a top view of the package based on the present invention.
Figure 4B:
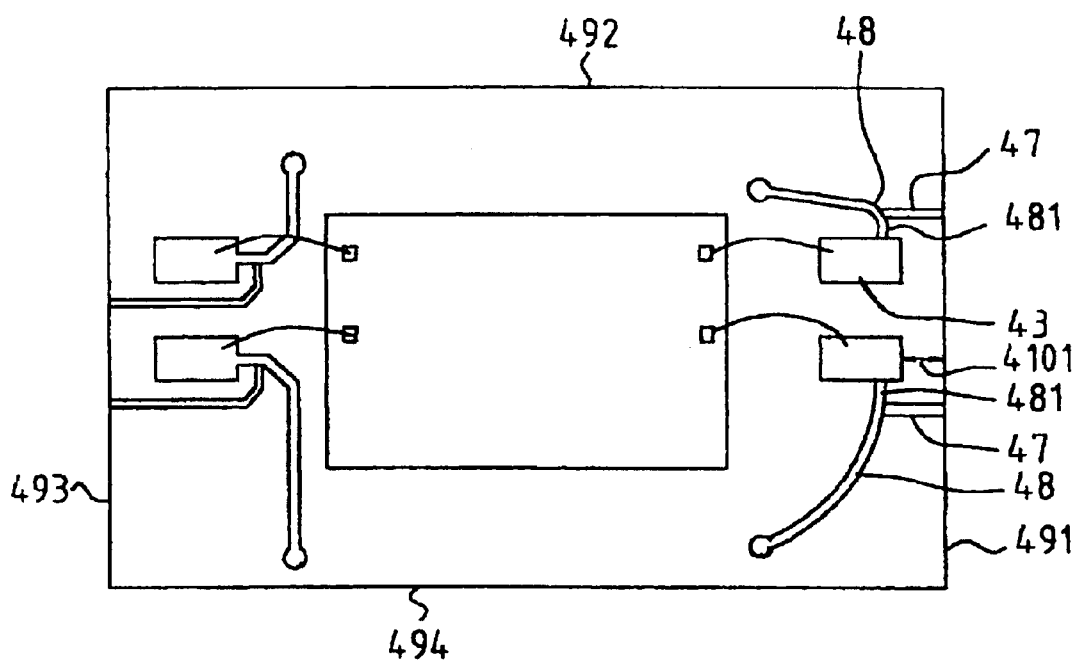

A third preferred embodiment of a semiconductor chip package according to the present invention is shown in FIG. 4, where components are configured in a way substantially the same as that shown in FIG. 2 except the location of connecting first conduction line 48 (a trace, for example) to bonding finger 43. In FIG. 4, second conduction line 47 (a plating-conduction-line, for example) is also electrically connected to bonding finger 43 through a conducting-auxiliary-path including at least a part 481 of first conduction line 48. The conducting-auxiliary-path may be just the part 481 of first conduction line 48.

The third preferred embodiment of a semiconductor chip package according to the present invention may have first conduction line 48 spaced from each edge 491, 492, 493, or 494 of the chip carrier 44 by a respective distance larger than a minimum value 4101 which defines the minimum space between bonding finger 43 and the edge 491 that is closest to bonding finger 43, whereby the path for moisture to penetrate to bonding finger 43 through the second conduction line 47 and the part 481 of first conduction line 48 can always be much longer than that of a conventional semiconductor chip package as shown in FIG. 1, where the plating-conduction-line 7 has an end on the edge 91 which is closest to bonding finger 3, and has another end connecting bonding finger 3 via a first line 301 of the bonding finger 3.

The chip carrier either in prior arts or in the embodiments provided by the present invention may have a solder mask layer on its front surface, which is not marked by numerical reference in the drawings.

While the invention has been described in terms of what are presently considered to be the most practical and preferred embodiments, it shall be understood that the invention is not limited to the disclosed embodiment. On the contrary, it is intended to cover various modifications and similar arrangements included within the spirit and scope of the claims which are to be accorded with the broadest interpretation so as to encompass all such modifications and similar structures.

What is claimed is:

1. A semiconductor chip package comprising:
   at least a semiconductor chip;
   at least a chip carrier having a front surface to which said chip is attached, and having a back surface, at least a via, and a plurality of edges;
   at least a bonding finger formed on the front surface of said chip carrier to electrically connect said chip;
   at least a metal pad attached to the back surface of said chip carrier;
   at least a first conduction line formed on the front surface of said chip carrier to connect said bonding finger and said metal pad through said via; and
   at least a second conduction line formed on the front surface of said chip carrier, with a first end thereof on an edge of said chip carrier, and a second end thereof connecting said first conduction line and electrically connecting to said bonding finger through at least a part of said first conduction line, wherein said at least a part of said first conduction line is between said bonding finger and the second end of said second conduction line, said second conduction line and said at least a part of said first conduction line are for conducting to said bonding finger the electrical current applied to the first end of said second conduction line for plating material on said bonding finger.

2. The semiconductor chip package according to claim 1 wherein said first conduction line is for conducting signals between said bonding finger and said metal pad.

3. The semiconductor chip package according to claim 2 wherein the second end of said second conduction line is between said bonding finger and said via.

4. The semiconductor chip package according to claim 1 wherein the second end of said second conduction line physically connects said first conduction line directly.

5. The semiconductor chip package according to claim 1 further comprising a chip-electrical-connector for said bonding finger to electrically connect said chip.

6. The semiconductor chip package according to claim 5 wherein said chip-electrical-connector is an electrical wire.

7. The semiconductor chip package according to claim 5 wherein said chip is a flip chip and said chip-electrical-connector is a bump of said chip.

8. The semiconductor package according to claim 5 further comprising at least an encapsulation layer covering said chip, said bonding finger, said first conduction line, said second conduction line, and said chip-electrical-connector.

9. The semiconductor chip package according to claim 1 wherein said at least a part of said first conduction line and said second conduction line are such that the total length of said at least a part of said first conduction line and said second conduction line is longer than the distance between said bonding finger and an edge of said chip carrier which is closest to said bonding finger.

10. A semiconductor chip package comprising:

at least a semiconductor chip;

at least a chip carrier having a front surface to which said chip is attached, and having a back surface, at least a via, and a plurality of edges;

at least a bonding finger formed on the front surface of said chip carrier to electrically connect said chip;

at least a metal pad attached to the back surface of said chip carrier;

at least a first conduction line formed on the front surface of said chip carrier to connect said bonding finger and said metal pad through said via; and at least a second conduction line formed on the front surface of said chip carrier, with a first end thereof on an edge of said chip carrier, and a second end thereof connecting said first conduction line, wherein the second end of said second conduction line is between said bonding finger and said via, and said second conduction line is for conducting to said bonding finger the electrical current applied to the first end of said second conduction line for plating material on said bonding finger.

* * * * *